United States Patent
Kondo et al.

(10) Patent No.: US 8,051,888 B2
(45) Date of Patent: Nov. 8, 2011

(54) SEED CRYSTAL FIXING DEVICE

(75) Inventors: Daisuke Kondo, Kodaira (JP); Takuya Monbara, Iruma (JP)

(73) Assignee: Bridgestone Corporation, Tokyo (JP)

( * ) Notice: Subject to any disclaimer, the term of this patent is extended or adjusted under 35 U.S.C. 154(b) by 358 days.

(21) Appl. No.: 12/444,105

(22) PCT Filed: Oct. 3, 2007

(86) PCT No.: PCT/JP2007/069390
§ 371 (c)(1),
(2), (4) Date: May 20, 2009

(87) PCT Pub. No.: WO2008/041728
PCT Pub. Date: Apr. 10, 2008

(65) Prior Publication Data
US 2010/0065223 A1   Mar. 18, 2010

(30) Foreign Application Priority Data
Oct. 3, 2006  (JP) ................................ P2006-271711

(51) Int. Cl.
*B32B 37/00* (2006.01)
(52) U.S. Cl. ..................... 156/581; 156/381; 117/216
(58) Field of Classification Search ............. 156/285, 156/381, 382, 580, 581, 583.1, 583.3; 117/109, 117/200, 216, 930
See application file for complete search history.

(56) References Cited

U.S. PATENT DOCUMENTS
| | | | |
|---|---|---|---|
| 7,497,906 B2 * | 3/2009 | Kondo et al. ................ | 117/109 |
| 2004/0171187 A1 | 9/2004 | Kataoka et al. | |
| 2005/0126471 A1 | 6/2005 | Jenny et al. | |

FOREIGN PATENT DOCUMENTS
| | | |
|---|---|---|
| JP | 11-171691 A | 6/1999 |
| JP | 2001-139394 A | 5/2001 |
| JP | 2003-119098 A | 4/2003 |
| JP | 2006-151756 A | 6/2006 |

OTHER PUBLICATIONS

Supplementary European Search Report dated Apr. 16, 2010 (4 pages).

* cited by examiner

*Primary Examiner* — James Sells
(74) *Attorney, Agent, or Firm* — Sughrue Mion, PLLC

(57) ABSTRACT

Provided is a seed crystal fixing device 1 for fixing a seed crystal 9 to a seed crystal placing part 3 of a reaction vessel with an adhesive interposed in between. The seed crystal fixing device 1 includes: a chamber 10 capable of installing the seed crystal placing part 3 in the inside thereof; and a flexible pouched body 16 placed on an upper surface of the chamber 10. The flexible pouched body 16 is inflated with a delivery of gas and is deflated with an exhaust of the gas. The flexible pouched body 16 is configured to come into contact with a surface of the seed crystal 9 when inflated, and thereby applies pressure uniformly across the entire surface of the seed crystal 9. The upper surface of the chamber 10 forms convex shape towards the seed crystal placing part 3, and thereby uniform press-bonding of the seed crystal 9 to the seed crystal placing part 3 is accomplished.

3 Claims, 3 Drawing Sheets

SEED CRYSTAL FIXING DEVICE

TECHNICAL FIELD

The present invention relates to a seed crystal fixing device for fixing a seed crystal to a seed crystal placing part of a reaction vessel with an adhesive interposed in between.

BACKGROUND ART

Silicon carbide has a larger band gap, more excellent in dielectric breakdown property, heat resistance, radiation resistance and the like as compared with silicon. Accordingly, it has been noticed as electronic device materials such as portable and high output semiconductors and the like. Further, due to excellent optical properties, it has been noticed as optical device materials. Among such silicon carbide crystals, silicon carbide single crystals have a merit that they are particularly excellent in uniformity of properties in wafer when applied to devices such as wafers and the like as compared with silicon carbide polycrystals.

Modified Lely method is known as a method of producing the above-mentioned silicon carbide single crystal. In the method, a sublimation raw material is held in a first end portion in a reaction vessel (crucible). A seed crystal of a silicon carbide single crystal is placed in a second end portion (seed crystal placing part) in the reaction vessel. The second end portion is positioned to face substantially the sublimation raw material. A silicon carbide single crystal is grown by subliming the sublimation raw material and then recrystallizing the sublimed raw material on the seed crystal.

When the seed crystal is grown without being completely bonded to the seed crystal placing part in Improved Lely method, macroscopic defects (void defects) penetrate through the seed crystal from the side of the seed crystal placing part where the seed crystal is not completely bonded into the growing crystal, and the quality of the wafer was liable to be impaired. Since the adhesive is gasified at high temperatures, it has been also conjectured that remaining bubbles of the gasified adhesive in the adhesive layer causes deterioration of the quality of the crystal.

Several techniques have been proposed as means for solving the above-mentioned problems (for example, refer to Patent Documents 1 and 2). For example, Patent Document 1 discloses a method of fixing a seed crystal of a silicon carbide single crystal by applying a predetermined pressure to the seed crystal. Patent Document 2 discloses a fixing method in which a weight is placed on a seed crystal of a silicon carbide single crystal for press-bonding the seed crystal onto the seed crystal placing part.

However, it was difficult to uniformly bond the entire surface of the seed crystal by the mechanical press-bonding method since it causes the surface of the seed crystal finely roughened. The press-bonding method using the weight also has difficulty in achieving uniformly press-bonding the entire surface of the seed crystal of a silicon carbide single crystal.

As has been described above, so far it has been expected that a seed crystal fixing device achieving uniformly press-bonding the entire surface of the seed crystal of a silicon carbide single crystal so as to grow the seed crystal while the seed crystal completely bonded with the seed crystal placing part.

Patent Document 1; Japanese Patent Application Publication No. 2001-139394
Patent Document 2: Japanese Patent Application Publication No. 2003-119098

DISCLOSURE OF THE INVENTION

The present invention provides a seed crystal fixing device for fixing a seed crystal to a seed crystal placing part with an adhesive interposed in between. The seed crystal fixing device includes: a chamber configured capable of installing the seed crystal placing part in the inside thereof; and a flexible pouched body placed on an upper surface of the chamber. The flexible pouched body is inflated with a delivery of gas and is deflated with an exhaust of the gas. The flexible pouched body contacts with a surface of the seed crystal when inflated, and thereby applies pressure uniformly across the entire surface of the seed crystal. In order to solve the above-described problem, the upper surface of the chamber forms convex shape towards the seed crystal placing part.

In addition, it is preferable that, in the seed crystal fixing device of the present invention, a groove be formed in the upper surface of the chamber.

Moreover, it is preferable that, in the seed crystal fixing device of the present invention, a gas delivery/exhaust port towards the flexible pouched body be formed at the central position of the upper surface of the chamber.

BRIEF DESCRIPTION OF THE DRAWINGS

FIG. 1(a) is a schematic sectional view of a seed crystal fixing device holding a seed crystal placing part on which a seed crystal is placed with an adhesive interposed in between. FIG. 1(b) is a top plan view of an upper chamber. FIG. 1(c) is a top plan view of a lower chamber.

FIGS. 2(a) to 2(g) are diagrams illustrating steps of a seed crystal fixing method.

BEST MODE FOR CARRYING OUT THE INVENTION

Figure 1:
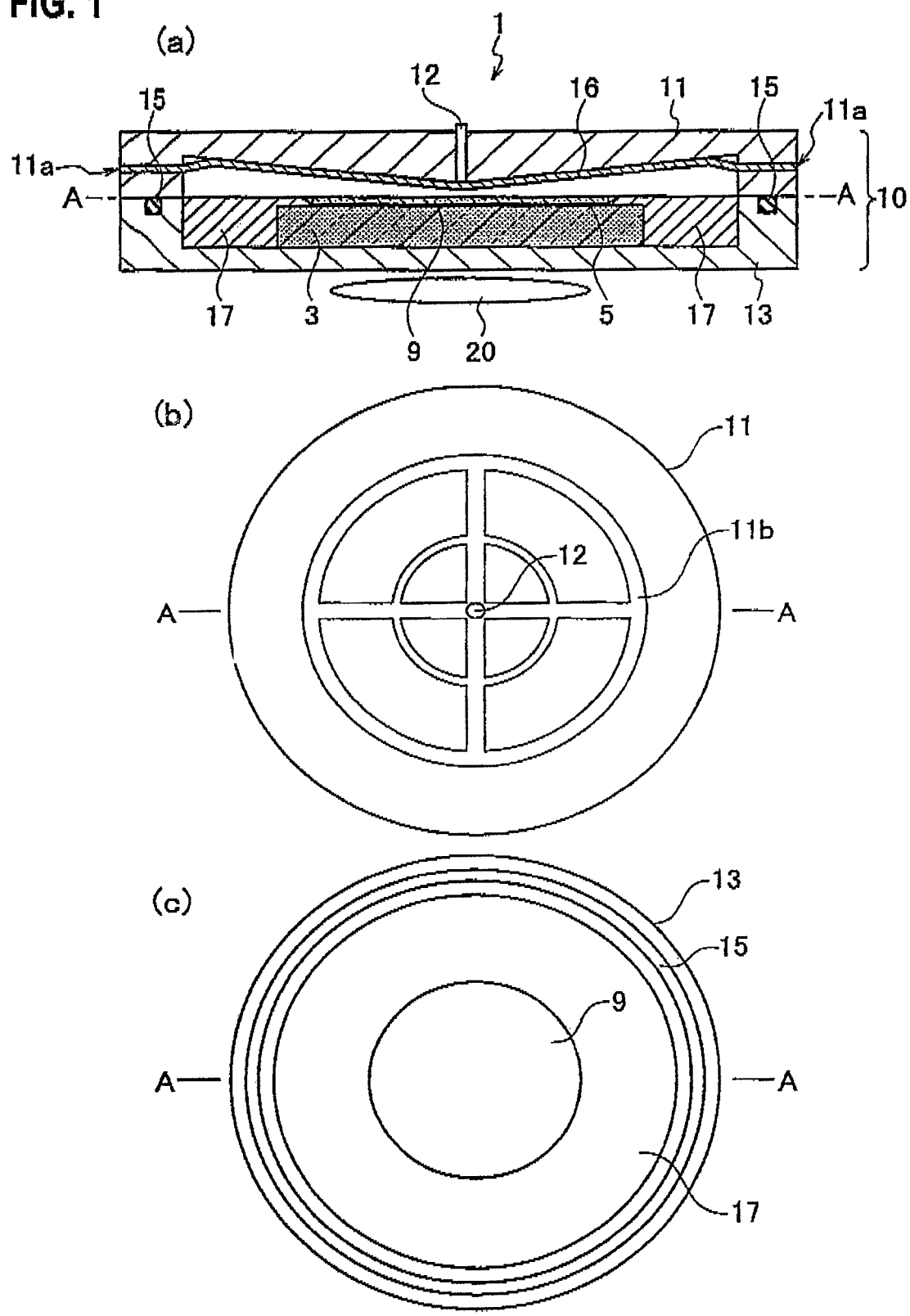
FIG. 1.

A seed crystal fixing device 1 of the present invention wily be described in detail below with reference to the drawings.
(Seed Crystal Fixing Device)

FIG. 1(a) shows a schematic sectional view of the seed crystal fixing device 1 holding a seed crystal placing part 3 on which a seed crystal 9 is placed with an adhesive 5 interposed in between. FIG. 1(b) shows a top plan view of an upper chamber. FIG. 1(c) shows a top plan view of a lower chamber.

As shown in FIG. 1(a), in the seed crystal fixing device 1 of this embodiment, the seed crystal 9 is fixed to the seed crystal placing part 3 of a reaction vessel with the adhesive 5 interposed in between. The seed crystal fixing device 1 includes a chamber 10 and a flexible pouched body 16. The seed crystal placing part 3 can be placed inside the chamber 10, and the chamber 10 can form a hermetic atmosphere. The flexible pouched body 16 is placed on the upper surface of the inside of the chamber 10. The flexible pouched body 16 can be inflated with a delivering of gas, and can be deflated with an exhaust of the gas. When inflated, the flexible pouched body 16 contacts with a surface of the seed crystal 9, and applies a uniform pressure to the entire surface of the seed crystal 9. The upper surface of the inside of the chamber 10 forms convex shape towards the seed crystal placing part 3. The seed crystal fixing device 1 also includes a heater 20 that heats and hardens the adhesive.

The flexible pouched body 16 is made of either a rubber or a resin. As shown in FIG. 1(a), the flexible pouched body 16 is fixed inside the chamber 10 by being clamped at sidewall portions 11a of the upper chamber 11.

The chamber 10 includes the upper chamber 11 and the lower chamber 13, which can, be assembled together and separated from each other freely. When the chamber 10 is used, the upper chamber 11 is fitted to the lower chamber 13 with an O-ring 15 installed in an outer-peripheral portion of the lower chamber 13. The chamber 10 can form a hermetic atmosphere accordingly. A gas inlet/outlet port (gas-delivery/exhaust port) 12 is formed substantially at the central position of the upper chamber 11. The seed crystal fixing device 1 can form a reduced-pressure atmosphere inside the chamber 10 by taking out air from the inside of the chamber 10 where a hermetic atmosphere is formed.

As shown in FIG. 1(b), the gas-inlet/outlet port 12 is formed substantially at the central position of the upper chamber 11. In the upper chamber 11, grooves 11b extended radially from the central position of the gas-inlet/outlet port 12. When the flexible pouched body 16 is inflated, the grooves 11b allow the air exhausted through the gas-inlet/outlet port 12 to disperse uniformly within the flexible pouched body 16. With this configuration, the air exhausted through the gas-inlet/outlet port 12 inflates firstly the central portion of the flexible pouched body 16 located right above the seed crystal placing part 3 and then inflates the peripheral portion of the flexible pouched body 16. Accordingly, the flexible pouched body 16 presses firstly the substantially central portion of the seed crystal 9 and then the peripheral portion of the seed crystal 9.

As shown in FIGS. 1(a) and 1(c), the lower chamber 13 includes a ring-shaped guide portion 17, which is provided to fix the seed crystal placing part 3 and to fix the seed crystal 9. After the seed crystal placing part 3 is installed in the lower chamber 13, the guide portion 17 is detachably fixed to the lower camber 13 and then the seed crystal 9 is mounted on top of the seed crystal placing part 3. Note that this way of fixing the seed crystal placing part 3 is not the only way. Alternatively, the seed crystal placing part 3 may be fixed by fitting the seed crystal placing part 3 into a hole dug in the chamber.

Figure 3:
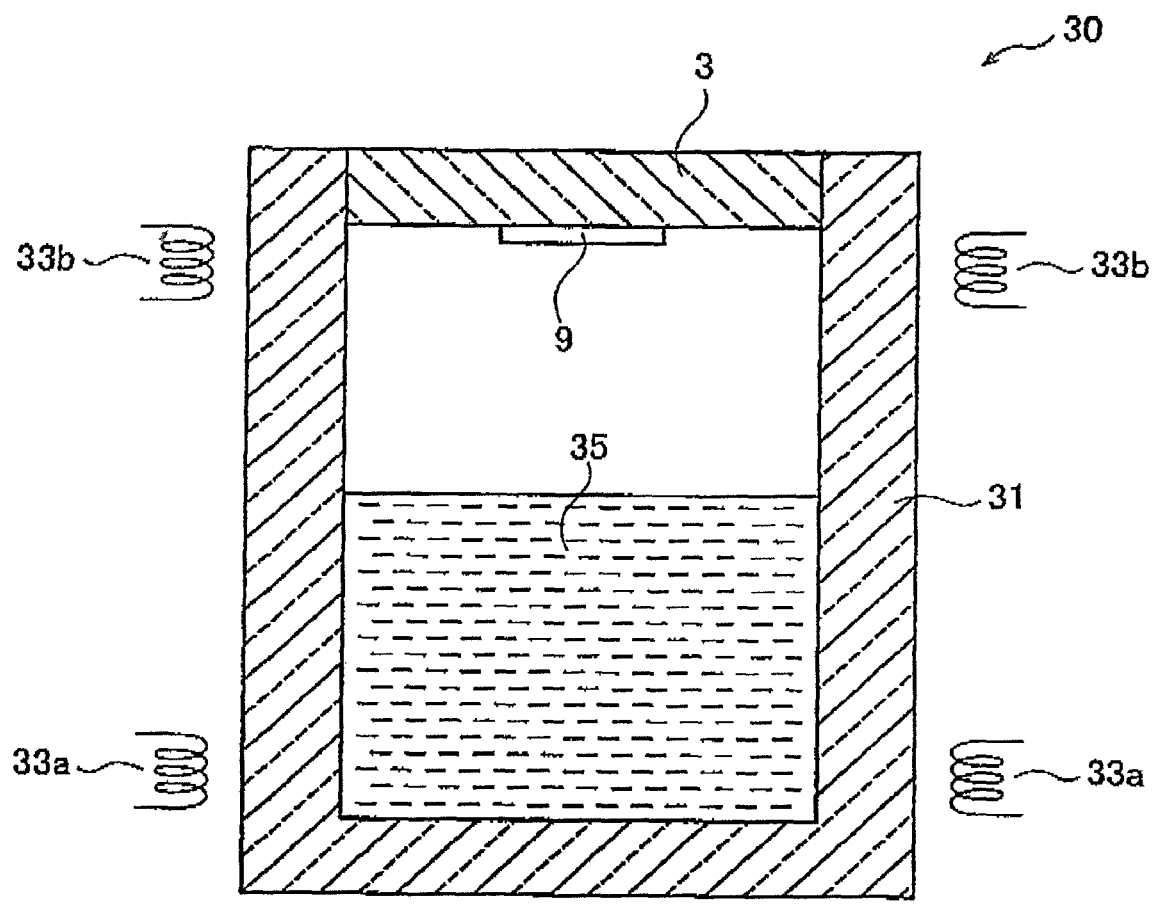
FIG. 3 is a schematic sectional view of an apparatus (crucible) for manufacturing a silicon carbide single crystal.

As an example of the seed crystal placing part 3 installed in the seed crystal fixing device 1, a seed crystal placing part 3 of a silicon carbide single crystal manufacturing apparatus 30 which will be described later and which is shown in FIG. 3 can be use. Although it depends on the purpose of use, as the seed crystal 9, a 6H-Lely crystal, a 6H-Acheson crystal and the like can be used. As the adhesive 5, resins, carbohydrates, and heat-resistant fine particles are enumerated. Some examples of the resins that can be used are thermosetting resins such as phenol resins, novolac resins, and furfuryl-alcohol resins. Alternatively, a mixture of a phenol resin with carbon powder can also be used. Some examples of the carbohydrates are sugars, specifically, monosaccharides such as glucose, polysaccharides such as cellulose, and derivatives of these monosaccharides and polysaccharides. Some examples of the heat-resistant fine particles are graphite (carbon), heat-resistant substances such as silicon carbide (SiC) and boron nitride (BN), high-melting-point metals such as tungsten and tantalum, and compounds of these metals such as carbides of these metals and nitrides of these metals.

(Seed Crystal Fixing Method)

A method of fixing a seed crystal according to an embodiment using the seed crystal fixing apparatus shown in FIG. 1 will be described with reference to FIGS. 2(a) to 2(g).

Figure 2:
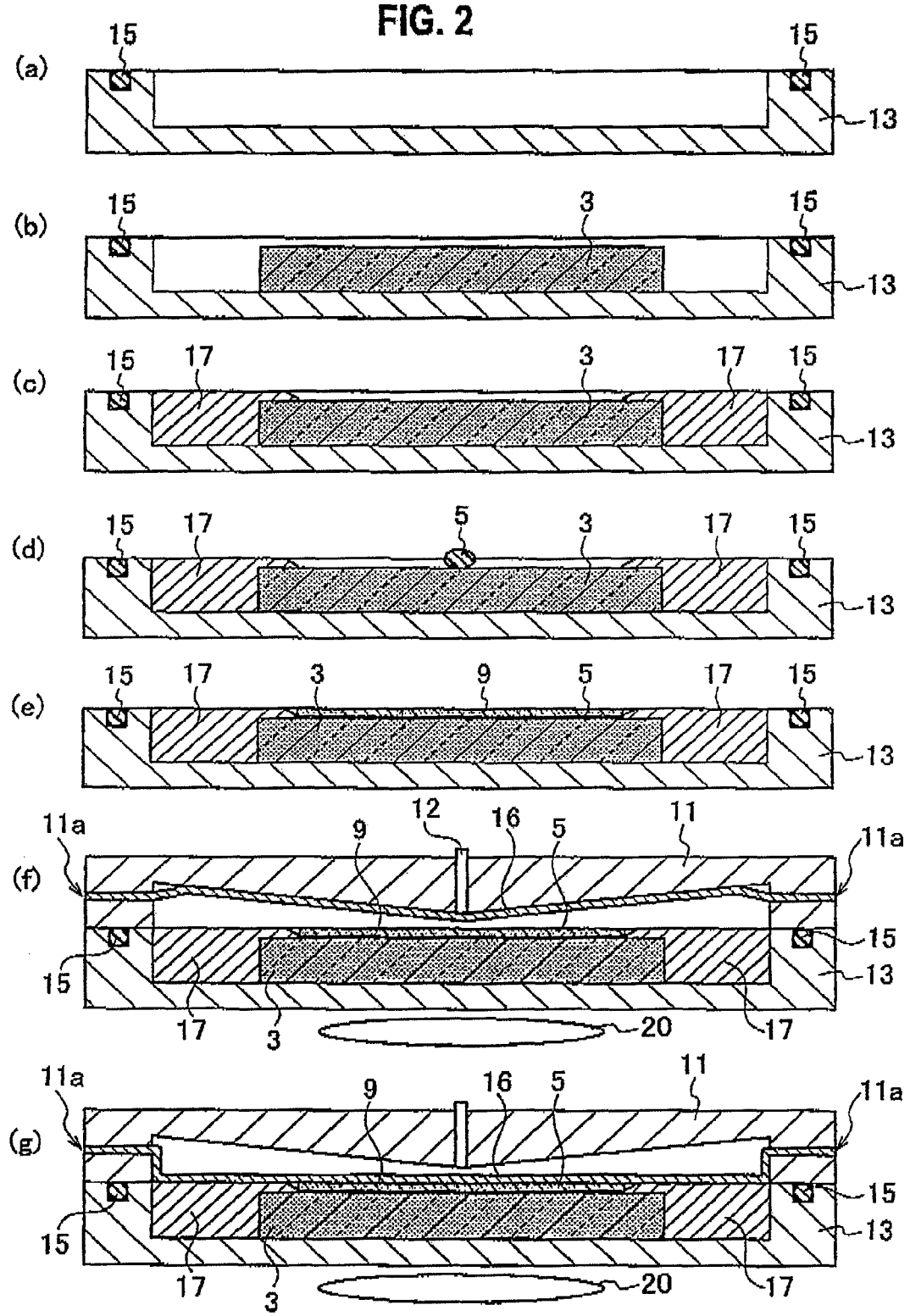
FIG. 2.

(i) Firstly, the lower chamber 13 is prepared as shown in FIG. 2(a).
(ii) Next, the seed crystal placing part 3 of the reaction vessel is placed in the lower chamber 13 as shown in FIG. 2(b).
(iii) Then, the seed crystal placing part 3 is fixed by the guide portion 17 as shown in FIG. 2(c).
(iv) The adhesive 5 is applied to the top of the seed crystal placing part 3 as shown in FIG. 2(d). The amount of the applied adhesive 5 preferably ranges from 1 μl/cm² to 25 μl/cm².
(v) Subsequently, as shown in FIG. 2(e), the seed crystal 9 is mounted on top of the seed crystal placing part 3 with the applied adhesive 5 interposed in between. For the purpose of improving the adhesiveness of the seed crystal 9 to the seed crystal placing part 3, it is preferable that the contact surface of the seed crystal 9 with the seed crystal placing part 3 be polished. Specifically, the surface roughness (Ra) of the contact surface of the seed crystal 9 is preferably equal to or smaller than 0.1 μm. In addition, it is preferable that the surface of the seed crystal placing part 3 on which the seed crystal 9 is mounted have a surface roughness equal to or smaller than 1.4 μm because such a low surface roughness contributes to an improvement in the adhesiveness.
(vi) As shown in FIG. 2(f), a hermetic atmosphere is formed by mounting the upper chamber 11 on the lower chamber 13.
(vii) As shown in FIG. 2(g), the flexible pouched body 16 is inflated by delivering gas through the gas-inlet/outlet port 12. Note that the inflating of the flexible pouched body 16 starts from the substantially central position of the flexible pouched body 16. Accordingly, the inflated flexible pouched body 16 presses firstly the substantially central portion of the seed crystal 9 located right below the substantially central position of the flexible pouched body 16. Subsequently, when the entire flexible pouched body 16 is inflated, the flexible pouched body 16 presses eventually the entire seed crystal 9. The flexible pouched body 16 is brought into contact with a surface of the seed crystal 9 on a side opposite to the seed-crystal mounting surface, and thus a uniform pressure is applied to the entire surface of the seed crystal 9. It is preferable that a load of a pressure ranging from 0.01 MPa to 1 MPa, approximately, be applied to the seed crystal 9.
(viii) The adhesive 5 is hardened by being heated with a heater 20. The conditions for the heating vary depending upon the properties of the adhesive (thermosetting resin). The adhesive 5 is to be heated at a temperature ranging from 100° C. to 1000° C., or more preferably from 100° C. to 300° C., for approximately 5 minutes to 10 minutes.

Note that if gas, which is produced when the adhesive 5 is hardened remains between the seed crystal 9 and the seed crystal placing part 3 as bubbles, the bubbles may possibly cause ununiform bonding. Accordingly, it is preferable that thermal hardening process of the adhesive 5 is performed under a reduced-pressure atmosphere while the air and the gas that may possibly cause the ununiform bonding are sucked out from the chamber 10 by a suction apparatus (not illustrated) connected to the gas-inlet/outlet port 12. When the reduced-pressure atmosphere is formed, the reduced-pressure atmosphere should be formed before the above-described step (vii). Performing the steps (vii) and (viii) after the formation of the reduced-pressure atmosphere contributes an effect of improving the uniformity of the pressure loaded on the seed crystal 9. In addition, the bonding under the same conditions at anytime helps to replicate the bonding state with more certainty. It is preferable that the reduced-pressure atmosphere be not higher than 300 Torr. Following the above-described procedure, the seed crystal 9 is fixed to the top of the seed crystal placing part 3.

(Silicon Carbide Single-Crystal Manufacturing Method)

Descriptions have been given thus far as to the seed crystal fixing method and the like. However, a silicon carbide single crystal manufacturing method is also provided as another embodiment of the present invention. Specifically what is provided is a silicon carbide single crystal manufacturing method including: placing a sublimation raw material in a reaction vessel to accommodate the sublimation raw material; mounting a seed crystal facing substantially the sublimation raw material; and recrystallizing the sublimed sublimation raw material on the seed crystal, so that a silicon carbide single crystal is grown. In the provided method, the single crystal is grown on the seed crystal that is fixed to the top of the seed crystal placing part by the seed crystal fixing method of the above-described embodiment.

A silicon carbide single crystal manufacturing apparatus 30 is used as the reaction vessel as shown in FIG. 3. The silicon carbide single crystal manufacturing apparatus 30 includes: a vessel 31 capable of accommodating a sublimation raw material 35; and the seed crystal placing part 3 detachably attached to the vessel 31 and capable of mounting the seed crystal 9 thereon. First induction coils 33a and second induction coils 33b are provided around the outer circumference of the reaction vessel to form a silicon carbide sublimation atmosphere. There is no special limitation on the vessel 31 as long as the silicon carbide sublimation atmosphere can be formed inside the vessel 31. For example, a crucible can be used as the vessel 31, and a preferable material for the vessel 31 is graphite. It is more preferable that the vessel 31 be made of a material with a thermal expansion coefficient that is substantially the same as that of the seed crystal. For facilitating the putting of the is sublimation raw material 35 in the vessel 31, it is preferable that the vessel 31 and the seed crystal placing part 3 be formed together and the seed crystal placing part 3 be detachably attached to the vessel 31. As means of joining the vessel 31 and seed crystal placing part 3 together, any means can be employed as long as the inside of the vessel 31 can be kept in a sealed-up state. An example of such joining means is screwing means.

As the sublimation raw material 35, various conventionally known materials can be used. An example of the sublimation raw material 35 is a silicon carbide powder obtained by heating and baking, under an argon atmosphere, a mixture obtained by mixing uniformly a highly pure tetraethoxysilane polymer used as the silicon source and a resol-type phenolic resin used as the carbon source. In addition, as a seed crystal of the silicon carbide single crystal, a conventionally known single crystal can be used.

There is no special limitation on the heating conditions, such as the heating temperature, under which the sublimation raw material 35 is heated. The heating conditions can be set up by those skilled in the art based on a known technique.

(Silicon Carbide Single Crystal)

The silicon carbide single crystal is manufactured according to the above-described silicon carbide single crystal manufacturing method. It is preferable that the silicon carbide single crystal has crystal defects (tubular defects) of 50 defects/cm$^2$ or less, preferably 10 defects/cm$^2$ or less when the single crystal is evaluated by etching with a molten alkali. The total content of metal impurity elements in the silicon carbide single crystal is preferably 10 ppm or less. Since the silicon carbide single crystal obtained in the invention has a quite high quality without mingling of polycrystals and polymorphic crystals and without crystal defects such as micropipes, it is excellent in dielectric breakdown resistance, heat resistance and radiation resistance, and may be favorably used for electronic devices such as semiconductor wafers and optical devices such as light emission diodes.

According to the aforementioned method for producing the silicon carbide single crystal of the invention, a high quality silicon carbide single crystal can be readily and efficiently produced without causing damages such as cracks.

Various embodiments of the invention made by the inventors have been described thus far, but the present invention is not limited to any of the descriptions and the drawings, of these embodiments, that form parts of the disclosure of the present invention. To put it differently, if those skilled in the art, based on the above-described embodiments, conceive of other embodiments, examples, and operating techniques, all of these must be included in the scope of the present invention.

INDUSTRIAL APPLICABILITY

According to the seed crystal fixing apparatus of the present invention, the upper surface of the chamber forms convex shape towards the seed crystal placing part. Accordingly, when the flexible pouched body is inflated, the substantially central portion of the seed crystal mounted on top of the seed crystal placing part is firstly brought into contact with the flexible pouched body and uniform press-bonding across the entire surface of the seed crystal can be accomplished.

The invention claimed is:

1. A seed crystal fixing device for fixing a seed crystal to a seed crystal placing part with an adhesive interposed in between, the seed crystal fixing device comprising:
   a chamber capable of installing the seed crystal placing part in the inside thereof; and
   a flexible pouched body placed on an upper surface of the chamber, the flexible pouched body is inflated with a delivery of gas and is deflated with an exhaust of the gas, the flexible pouched body contacts with a surface of the seed crystal when inflated, thereby applying pressure uniformly across the entire surface of the seed crystal,
   wherein the upper surface of the chamber forms convex shape towards the seed crystal placing part.

2. The seed crystal fixing device according to claim 1, wherein a groove is formed in the upper surface of the chamber.

3. The seed crystal fixing device according to claim 1, wherein a gas delivery/exhaust port towards the flexible pouched body is formed at a central portion in the upper surface of the chamber.

* * * * *